US008040189B2

(12) United States Patent
Leek

(10) Patent No.: US 8,040,189 B2
(45) Date of Patent: Oct. 18, 2011

(54) MICROWAVE SYSTEM FOR DRIVING A LINEAR ACCELERATOR

(76) Inventor: Paul H. Leek, Woodbridge, CT (US)

( * ) Notice: Subject to any disclaimer, the term of this patent is extended or adjusted under 35 U.S.C. 154(b) by 1308 days.

(21) Appl. No.: 11/641,224

(22) Filed: Dec. 19, 2006

(65) Prior Publication Data

US 2010/0231144 A1 Sep. 16, 2010

Related U.S. Application Data

(60) Provisional application No. 60/751,570, filed on Dec. 20, 2005.

(51) Int. Cl.
*H03L 7/00* (2006.01)

(52) U.S. Cl. .......... 331/5; 331/6; 331/7; 331/82; 331/83

(58) Field of Classification Search ........................ None
See application file for complete search history.

(56) References Cited

U.S. PATENT DOCUMENTS

| | | | | |
|---|---|---|---|---|
| 2,880,356 | A | 3/1959 | Daniel et al. | |
| 2,931,941 | A | 4/1960 | Dewey, II et al. | |
| 2,992,357 | A | 7/1961 | Nygard | |
| 3,714,592 | A * | 1/1973 | Jory | 315/5.13 |
| 4,162,459 | A | 7/1979 | Scharfman | |
| 4,584,582 | A | 4/1986 | Munger | |
| 4,634,992 | A | 1/1987 | Brown | |
| 5,363,054 | A * | 11/1994 | Bekefi | 330/4 |
| 5,410,283 | A | 4/1995 | Gooray et al. | |
| 5,933,335 | A | 8/1999 | Hitchcock et al. | |
| 6,518,706 | B1 | 2/2003 | Yugami et al. | |
| 6,844,689 | B1 | 1/2005 | Brown et al. | |
| 7,110,500 | B2 | 9/2006 | Leek | |
| 7,140,771 | B2 | 11/2006 | Leek | |
| 2005/0078794 | A1 * | 4/2005 | Leek | 378/111 |
| 2005/0109879 | A1 * | 5/2005 | Patterson | 244/172 |
| 2006/0208672 | A1 * | 9/2006 | Achenbach et al. | 315/500 |
| 2008/0211431 | A1 * | 9/2008 | Mishin et al. | 315/505 |

OTHER PUBLICATIONS

Bostick, Winston, et al., "Parallel Operation of Magnetrons", Massachusetts Institute of Technology Research Laboratory of Electronics Technical Report No. 14, 1946, pp. 1-7.
Collins, George B., Microwave Magnetrons, 1948, sections 7.5, 7.6 and 7.7, pp. 316-338, McGraw-Hill Book Company, New York.
De Leeuw, R.W. et al., "The RF Power Set Up for a Linac—Racetrack Microtron Combination" (EPAC96), Fifth European Particle Accelerator Conference, vol. 3, 1997, pp. 2137-2139, vol. XP00243944S, ISBN 0-7503-0386-7, Institute of Physics Publishing, Bristol, UK.

* cited by examiner

*Primary Examiner* — Tuyet Thi Vo
(74) *Attorney, Agent, or Firm* — Holland & Bonzagni, P.C.; Mary R. Bonzagni, Esq.

(57) ABSTRACT

A microwave system for driving a linear accelerator is provided. The inventive microwave system employs a plurality of magnetrons, at least one pulse generator to energize the magnetrons, means for synchronizing outputs from the magnetrons, and at least one waveguide for transmitting synchronized outputs or power from the magnetrons to a linear accelerator. The linear accelerator that is driven by the inventive microwave system demonstrates increased efficiency and dependability, higher energy and power outputs, as well as, different energy outputs that can take the form of successive pulses that alternate between at least two different energy levels.

17 Claims, 6 Drawing Sheets

MICROWAVE SYSTEM FOR DRIVING A LINEAR ACCELERATOR

RELATED APPLICATION

This application claims priority from U.S. Provisional Patent Application Ser. No. 60/751,570, filed Dec. 20, 2005, which is herein incorporated by reference in its entirety.

TECHNICAL FIELD

The present invention generally relates to a microwave system for driving a linear accelerator, and more particularly relates to a microwave system that employs a plurality of magnetrons.

BACKGROUND AND SUMMARY OF THE INVENTION

Linear accelerators require power in the form of high power pulses of short duration. This form of power can be supplied by either a magnetron or a klystron.

Magnetrons are relatively high efficiency, self-oscillating, diode-type electron tubes that are used to produce microwave energy. These electron tubes, which are typically small, light weight and relatively inexpensive, with some models being readily available for purchase, offer peak power levels of up to 5 megawatts (MW) and average power levels of about 10 kilowatts (kW). Power levels, however, are not as high as those offered by klystrons. In addition, magnetrons have a relatively short lifespan (i.e., 3,000 operating hours), cannot easily be rebuilt, and their self-oscillation operation is affected by feedback, especially from highly reactive loads.

Klystrons are specialized vacuum tubes called linear-beam tubes. These tubes offer relatively high power (i.e., up to 30 MW peak power and up to 100 kW average power for an S-band tube, with even higher powers for L-band (1 gigahertz (GHz)) and lower frequency tubes). Tube operation is relatively quiet electrically, but efficiency is low. While these tubes can be rebuilt and offer a relatively long lifespan of up to 20,000 operating hours, they are large and heavy and require a large solenoid. In addition, these tubes are relatively expensive and are not readily available, in some cases requiring delivery times of greater than one or two months.

A need exists for a microwave system to drive a linear accelerator that addresses at least some of the drawbacks associated with these conventional power sources.

The present invention satisfies this need by providing a microwave system for driving a linear accelerator that employs a plurality of magnetrons. More specifically, the inventive system, which offers, among other things, increased magnetron life and improved system reliability, comprises: a plurality of magnetrons; at least one pulse generator to energize the magnetrons; means for synchronizing the frequency and phase of outputs from the magnetrons; and at least one waveguide for transmitting the synchronized outputs or power from the magnetrons to the linear accelerator.

In one embodiment, outputs from the magnetrons are synchronized by arranging at least one pair of magnetrons in parallel and for each such magnetron pair, reflecting a small amount of power from each magnetron in the pair back into the other magnetron, thereby locking their respective outputs. In this embodiment, the inventive microwave system comprises:

(a) at least one pair of magnetrons arranged in parallel and having equal waveguide lengths;

(b) one or two high power pulse generators for each magnetron pair, wherein the pulse generator(s) is connected to one or both magnetrons in the magnetron pair;

(c) coupling means for coupling outputs from each magnetron in a magnetron pair, and optionally for further coupling already coupled outputs from the magnetron pairs; and (d) at least one waveguide for transmitting coupled output from the coupling means to the linear accelerator, wherein the waveguide has a section with a mismatch for reflecting a small amount of power from each magnetron in a magnetron pair into output from the other magnetron.

In another embodiment, the magnetrons are synchronized by designating at least one magnetron as a master and one or more remaining magnetrons as slaves and by injecting small amounts of power from the master magnetron(s) into output from the slave magnetron(s). In this embodiment, the inventive microwave system comprises:

(a) a plurality of magnetrons including at least one master magnetron and at least one slave magnetron;

(b) at least one high power pulse generator, wherein the pulse generator(s) is connected to one or more magnetrons;

(c) a coaxial line or waveguide in communication with the master magnetron(s) and the slave magnetron(s) for injecting small amounts of power from the master magnetron(s) into output from the slave magnetron(s); and (d) at least one waveguide for transmitting the outputs from the magnetrons to the linear accelerator.

The present invention also provides a radiation (i.e., electron, x-ray) source comprising a linear accelerator, and connected thereto, a microwave system, as described herein above. The inventive radiation source offers increased efficiency and dependability, higher energy and power outputs, as well as, different energy outputs that can take the form of successive pulses that can alternate between at least two different energy levels.

The present invention further provides a method of driving a linear accelerator, the method comprising: employing a plurality of magnetrons; synchronizing outputs from the magnetrons; and delivering the synchronized outputs or power to a linear accelerator.

Other features and advantages of the invention will be apparent to one of ordinary skill from the following detailed description and accompanying drawings.

Unless otherwise defined, all technical and scientific terms used herein have the same meaning as commonly understood by one of ordinary skill in the art to which this invention belongs. All publications, patent applications, patents and other references mentioned herein are incorporated by reference in their entirety. In case of conflict, the present specification, including definitions, will control. In addition, the materials, methods, and examples are illustrative only and not intended to be limiting.

BRIEF DESCRIPTION OF THE DRAWINGS

Particular features of the disclosed invention are illustrated by reference to the accompanying drawings in which.

BEST MODE FOR CARRYING OUT THE INVENTION

Figure 1A:
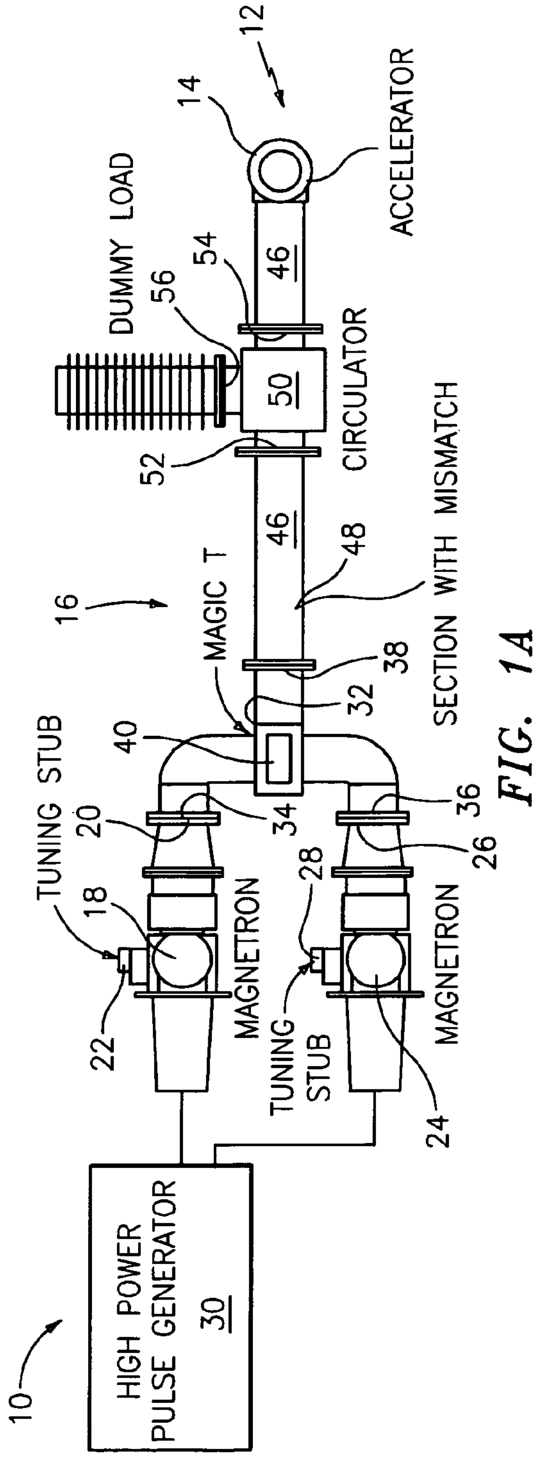
FIG. 1A is a simplified schematic plan view of a preferred embodiment of the radiation source of the present invention where a pair of magnetrons are arranged in parallel and their respective outputs synchronized by reflecting power from each magnetron in the pair to the other magnetron, thereby locking their respective outputs.

As noted above, it has been discovered by way of the present invention that linear accelerators driven by several smaller, less expensive magnetrons can provide higher energy and higher power outputs. It has also been discovered that these accelerators can produce different energy outputs, and that these outputs can be made to "jump" from one energy level to another.

Furthermore, the microwave system of the present invention serves to increase linear accelerator efficiency. Accelerator efficiency (Q) is equal to the quotient of electron beam power (Pb) divided by total power (Pt) [Q=Pb/Pt]. In most applications, Pb is about ½ of Pt, for an efficiency of 50%. By way of the present invention, Pb can increase to about ¾ of Pt, for an efficiency of 75% or more.

An increase in the operational life of magnetrons is also achieved using the microwave system of the present invention. Most accelerator applications operate with the magnetron at or close to maximum output peak power, which limits operational life. The present invention permits the same or higher levels of operation with improved life and reliability. In addition, where the inventive microwave system employs a plurality of magnetrons, continuous or near continuous operation may be achieved. Many contemplated end-use applications (i.e., security applications) require continuous or near continuous operation. In the event of a magnetron failure the operation is down. The present inventive system would permit operation at a reduced level using one magnetron. The corollary to this is that the operator may only need the high power operation occasionally and so under normal operation the system could use the magnetrons alternately. This would then provide a 'backup' magnetron when one failed.

The radiation source of the present invention, as noted above, comprises a linear accelerator, and a microwave system that is connected to the linear accelerator.

The linear accelerator of the inventive radiation source is known and, in one embodiment, is an elongate accelerator structure that defines a linear electron flow path. Such an accelerator structure is generally made up of two basic sections, namely, a coupler section, and an accelerator section. The coupler section is a device that serves to transmit microwave power into the accelerator section. The accelerator section is composed of a series of identical cavities in which the transmitted microwave power is used to accelerate an electron beam. The cavities are brazed together to establish good electrical contact for the flow of microwave current and to provide an ultra-high vacuum seal.

The microwave system is made up of a plurality of magnetrons, at least one pulse generator (e.g., a "soft-tube" line type modulator) to energize the magnetrons, means for synchronizing the frequency and phase of the magnetron outputs, and at least one waveguide for transmitting the coupled outputs or power from the magnetrons to either the coupler or accelerator section of the linear accelerator. The pulse generator is generally made up of a power supply, a pulse forming network (PFN), a high voltage switch such as a hydrogen thyratron tube, and a pulse transformer.

The outputs from the magnetrons may be synchronized using any suitable technique or approach including, but not limited to, (a) using at least one pair of magnetrons arranged in parallel and for each such magnetron pair reflecting power from one magnetron back to the other magnetron, and vice versa, thereby locking their respective outputs, and (b) designating at least one magnetron as a master and one or more remaining magnetrons as slaves and injecting small amounts of power from the master magnetron(s) back into output from the slave magnetron(s).

The first approach for synchronizing magnetron outputs basically involves locking the frequency and phase of the outputs of a pair of magnetrons by using magnetrons having the same waveguide length and by reflecting a small amount of power from one magnetron in that pair back into the output of the other magnetron, and vice versa.

The second or master/slave approach for synchronizing magnetron outputs is described in U.S. Pat. No. 4,162,459 to Scharfman and basically involves controlling the frequency and phase of the output of one or more slave magnetrons by injecting small amounts of microwave power from one or more master magnetrons back into output from the slave magnetron(s).

The above approaches for synchronizing magnetron outputs may use coupling means in the form of hybrid microwave devices or 3 dB couplers to combine the magnetron outputs. These devices are capable of coupling the power to one of two isolated ports when power is applied equally to two other ports with a 180° or 90° phase differential. Suitable hybrid microwave devices or 3 dB couplers include, but are not limited to, magic T couplers, narrow wall couplers, broad wall couplers, and short slot hybrids. Preferably, the hybrid device is selected from the group of magic T couplers and narrow wall 3 dB couplers, and more preferably, the hybrid device is a magic T coupler. Magic T couplers offer four ports that are physically separated, making it easier to use these devices. Moreover, there is a 90° phase change between the H and E arms of magic T couplers, which serves to simplify the waveguide layout.

Figure 1B:
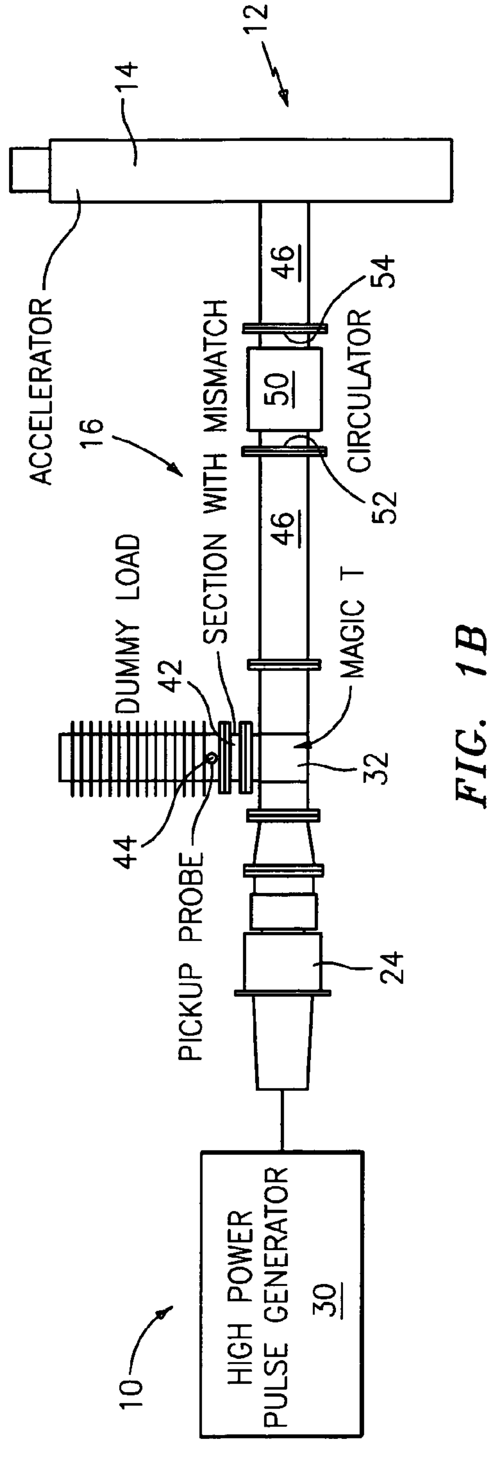
FIG. 1B is a simplified schematic side view of the inventive radiation source shown in FIG. 1A.

Referring to FIGS. 1A and 1B, an embodiment of the radiation source of the present invention is shown generally at 10. In this embodiment, the radiation source 10 comprises: a linear accelerator 12 having one accelerator section 14; and microwave system 16, which drives the linear accelerator 12.

Microwave system 16, which utilizes the first approach for synchronizing magnetron outputs, is made up of:

(a) a first magnetron 18 having an outlet port 20, a waveguide length, and a frequency tuning stub 22 for tuning operating frequencies;

(b) a second magnetron 24 in parallel with the first magnetron 18 having an outlet port 26, a waveguide length that is equal to the waveguide length of the first magnetron 18, and a frequency tuning stub 28;

(c) a high power pulse generator 30 connected to both the first magnetron 18 and the second magnetron 24;

(d) a magic T coupler 32 having four ports 34, 36, 38, 40, with port 40 having an output leg employing a mismatch 42, a pickup probe 44 and terminating in a dummy load, coupler 32 being in direct communication via port 34 with the outlet port 20 of the first magnetron 18 and via port 36 with the outlet port 26 of the second magnetron 24;

(e) a waveguide 46 for transmitting power from the magic T coupler 32, waveguide 46 employing a section with a mismatch 48; and (f) a circulator 50 for isolating the first and second magnetrons 18, 24, from reflected power from the accelerator 12, which has three ports 52, 54, 56, with port 56 having an output leg terminating in a dummy load, circulator 50 being in direct communication via port 52 and waveguide 46 with coupler 32 and via port 54 and waveguide 46 with the linear accelerator 12.

In operation, the frequency of magnetrons 18, 24, are tuned using frequency tuning stubs 22, 28, power from the magnetrons enter ports 34, 36 of the magic T coupler 32 and is combined. Where the length of the two magnetron waveguide runs is the same, full power will exit from port 38, and no power will come out of port 40. In a preferred embodiment, a high power phase shifter (not shown) is added in one magnetron line, allowing the power to be shifted from 100% out of port 38 and 0% out of port 40, to 0% out of port 38 and 100% out of port 40.

In practice, when outputs or power from magnetrons 18, 24 are synchronized and on tune, there is no power in the output leg or "E" arm extending from port 40 of coupler 32. The power in the "E" arm increases as one magnetron is tuned with respect to the other magnetron. As such, monitoring for low or minimal power levels in the "E" arm is a simple way to ensure that the magnetrons 18, 24 are synchronized.

As will be readily appreciated by those skilled in the art, the above operation depends on the imperfect directivity of magic T coupler 32, which results in some of the power from magnetron 18 "leaking" into the output from magnetron 24, and vice versa. In order to control this leakage, a small (e.g., a voltage standing wave ratio (VSWR) of approximately 1.3) mismatch is added to the waveguide 46 extending from port 38, and preferably is added to both the waveguide 46 extending from port 38 and the output leg extending from port 40. The mismatch ensures that approximately 10 to 15% of the power is reflected, with the reflected power from one magnetron locking the other and vice versa. The two magnetrons are frequency and phase locked together, so that if one magnetron is tuned, the combination tunes at half the single tube rate.

As will also be readily appreciated by those skilled in the art, where coupler 32 is a hybrid with an inherent 3 dB coupling, if one magnetron is switched off, then the output is divided evenly between port 38 and port 40. This effectively reduces the output at one port to one-half of the magnetron power level and thus one-quarter of the combined power level.

Figure 2:
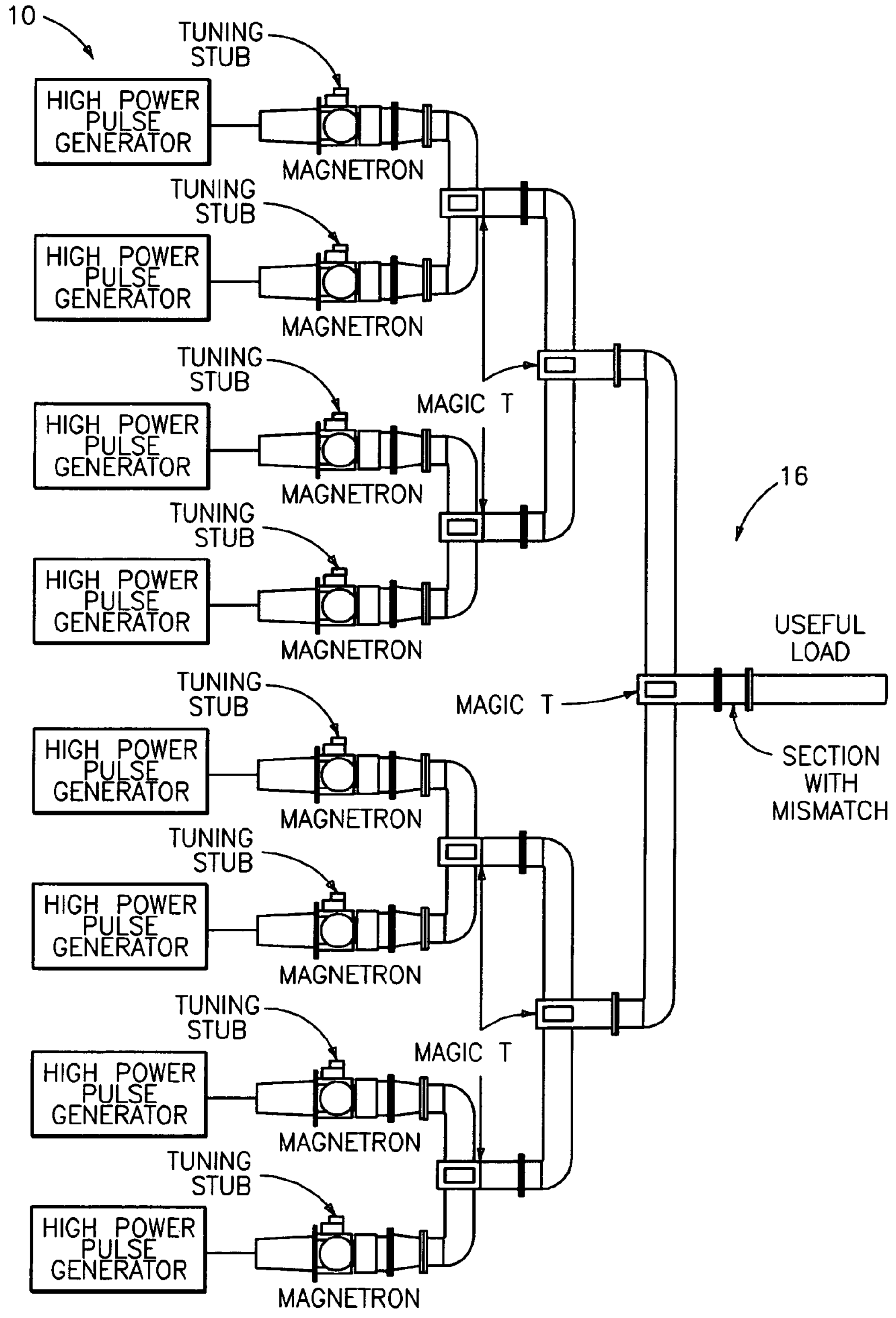
FIG. 2 is a simplified plan view of a preferred embodiment of the microwave system for driving a linear accelerator of the present invention where outputs from four pairs of magnetrons are synchronized and combined to produce a useful load.

As best shown in FIG. 2, multiple magnetron pairs can be used in the microwave system of the present invention. In this embodiment, magic T couplers are used to combine outputs from each magnetron pair, and already coupled outputs, thereby forming a so-called output "tree". Almost any power output may be achieved using such an arrangement.

Figure 3:
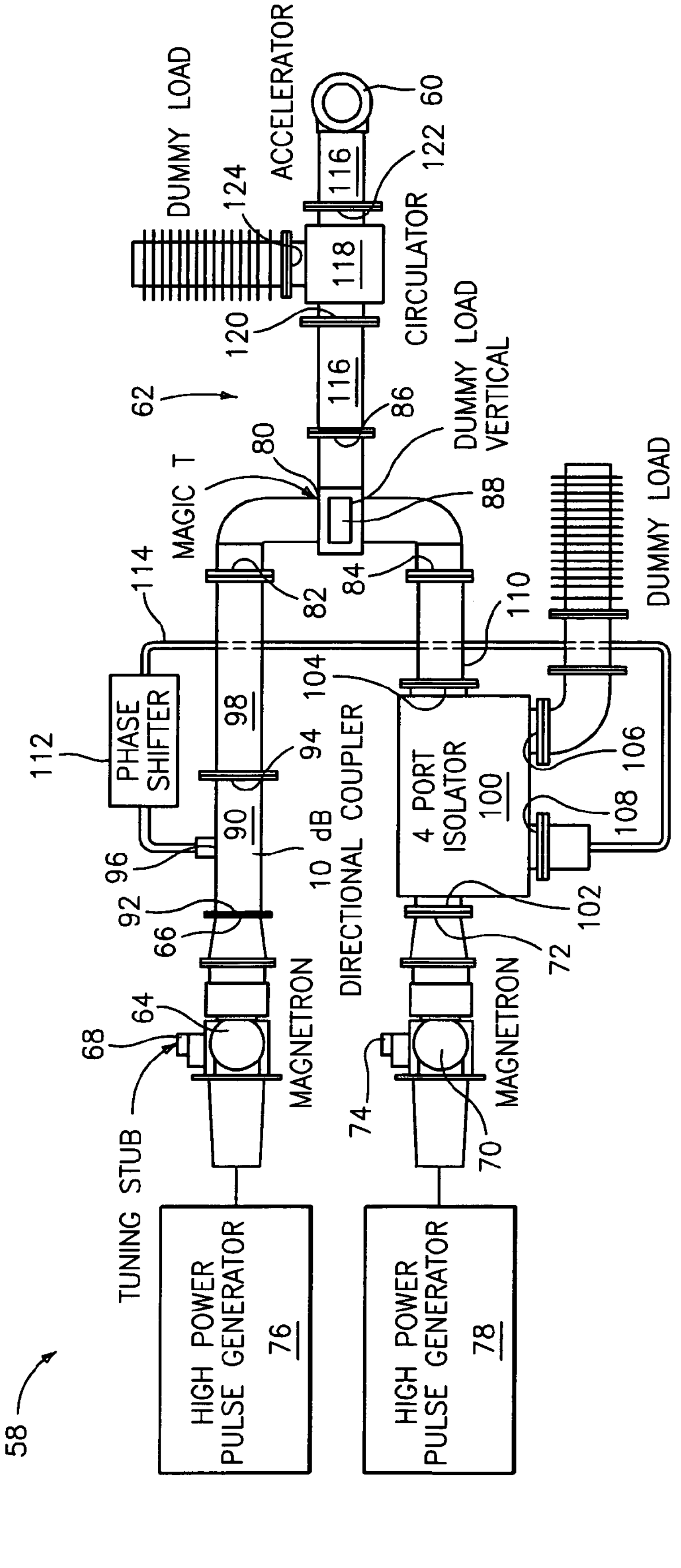
FIG. 3 is a simplified plan view of another preferred embodiment of the radiation source of the present invention where outputs from two magnetrons are synchronized by designating one magnetron as a master and the other magnetron as a slave.

Referring now to FIG. 3, another embodiment of the radiation source of the present invention is shown generally at 58. In this embodiment, the radiation source 58 comprises a linear accelerator 60; and a microwave system 62. The microwave system 62, which utilizes the second approach for synchronizing magnetron outputs, is made up of:

(a) a master magnetron 64 having an outlet port 66, a waveguide length, and a frequency tuning stub 68;

(b) a slave magnetron 70 in parallel with the master magnetron 64 having an outlet port 72, a waveguide length that is the same as the waveguide length of the master magnetron 64, and a frequency tuning stub 74;

(c) a first and a second high power pulse generator 76, 78 connected to the master magnetron 64 and slave magnetron 70, respectively;

(d) a magic T coupler 80 having four ports 82, 84, 86, 88, with port 88 having an output leg terminating in a dummy load;

(e) a 10 dB directional coupler 90 having three ports 92, 94, 96, located between and in direct communication via port 92 with outlet port 66 of master magnetron 64 and via port 94 and waveguide 98 with port 82 of magic T coupler 80;

(f) an isolator 100 having four ports 102, 104, 106, 108, with port 106 having an output leg terminating in a dummy load, isolator 100 being located between and in direct communication via port 102 with outlet port 72 of slave magnetron 70 and via port 104 and waveguide 110 with port 84 of magic T coupler 80;

(g) a phase shifter 112 in direct communication via high power coaxial line or waveguide 114 with port 96 of directional coupler 90 and port 108 of isolator 100;

(h) a waveguide 116 for transmitting power from the magic T coupler 80; and (i) a circulator 118 for isolating the master and slave magnetrons 64, 70, from reflected power from the accelerator 60, which has three ports 120, 122, 124, with port 124 having an output leg terminating in a dummy load, circulator 118 being in direct communication via port 120 and waveguide 116 with coupler 90 and via port 122 and waveguide 116 with the linear accelerator 60.

In operation, the frequency of the radiation generated by the slave magnetron 70 is continuously adjusted to match the radiation frequency of the master magnetron 64 by injecting synchronizing signal from the master magnetron 64 through high power coaxial line or waveguide 114 into isolator 100 via port 108. In the set-up shown in FIG. 3, all of the slave magnetron 70's power comes out of port 104 of isolator 100, with port 106 taking power reflected from the load.

Figure 4:
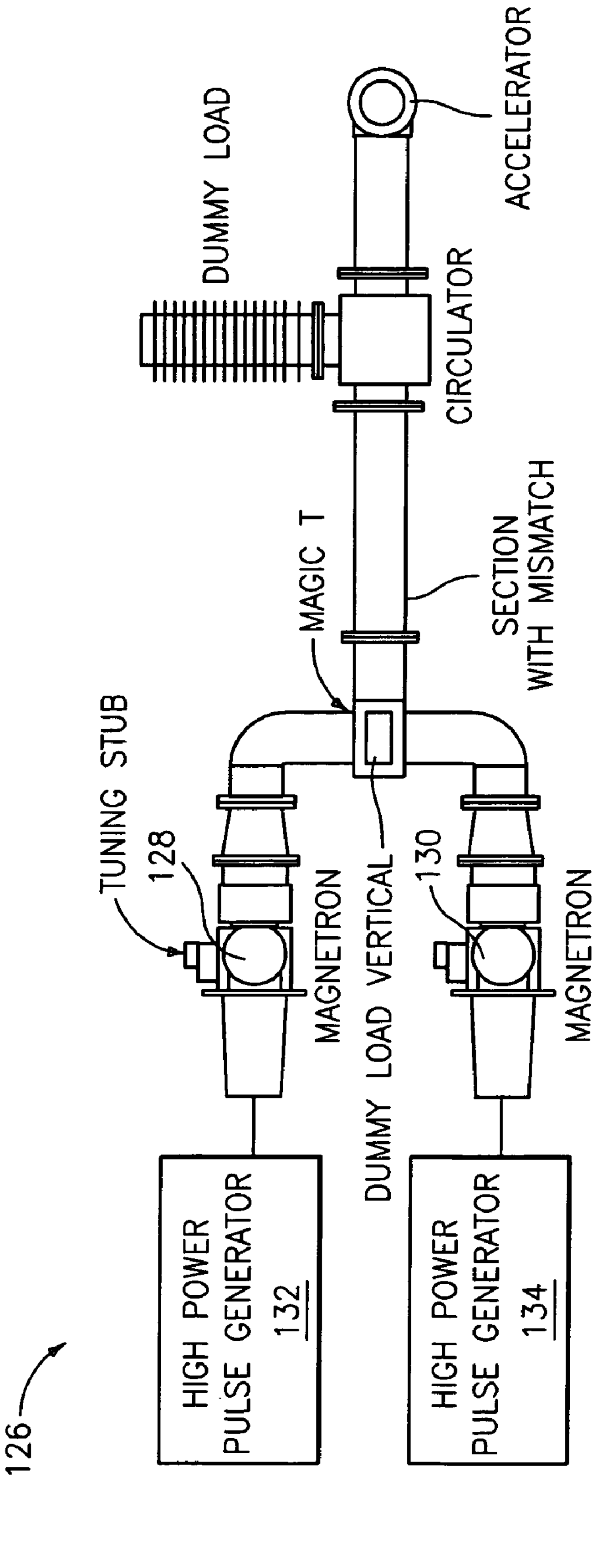
FIG. 4 is a simplified plan view of yet another preferred embodiment of the radiation source of the present invention where each magnetron in a magnetron pair is provided with a high power pulse generator having a pulse forming network or PFN thereby facilitating "energy hopping" or "energy jumping"

Referring to FIG. 4, an "energy hopping" or "energy jumping" embodiment of the radiation source of the present invention is shown generally at 126. In this embodiment, a first magnetron 128 and a second magnetron 130 are each provided with a high power pulse generator 132, 134, respectively. "Energy hopping" or "energy jumping" is basically achieved by operating the first magnetron 128 alone and then together with the second magnetron 130. This allows for large changes in the linear accelerator's peak power outlet.

Figure 5:
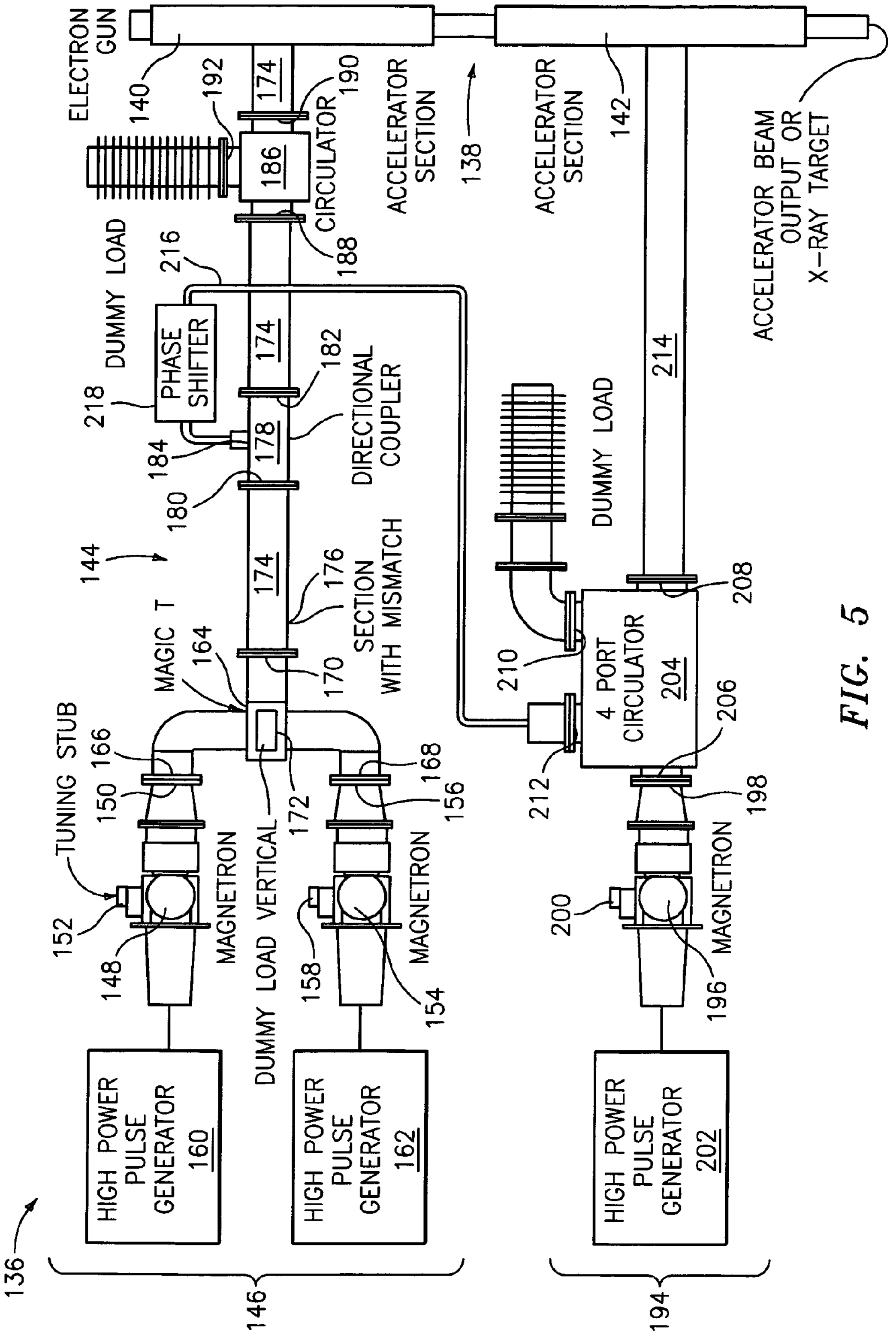
FIG. 5 is a simplified plan view of yet another preferred embodiment of the radiation source of the present invention where three magnetrons, each with an associated high power pulse generator, are used to provide the radiation source with the capability of operating at three different energy levels.

In FIG. 5, a combination of the two approaches described above for synchronizing magnetron outputs is used in the inventive radiation source, which is capable in this embodiment of operating at three different energies, namely, 4, 8 and 16 megavolts (MV). The radiation source in FIG. 5, which is shown generally at 136, comprises: a linear accelerator 138 having a first and a second accelerator section 140, 142; and a microwave system 144, with the microwave system 144 made up of:

(I) a first section 146 comprising:
   a. a first magnetron 148 having an outlet port 150, a waveguide length, and a frequency tuning stub 152;
   b. a second magnetron 154 in parallel with the first magnetron 148 having an outlet port 156, a waveguide length that is equal to the waveguide length of the first magnetron 148, and a frequency tuning stub 158;
   c. a first and a second high power pulse generator 160, 162 connected to the first magnetron 148 and the second magnetron 154, respectively;
   d. a magic T coupler 164 having four ports 166, 168, 170, 172, with port 172 having an output leg terminating in a dummy load, coupler 164 being in direct communication via port 166 with the outlet port 150 of the first magnetron 148 and via port 168 with the outlet port 156 of the second magnetron 154;
   e. a waveguide line 174 for transmitting power from the magic T coupler 164, the waveguide line 174 employing a section with a mismatch 176;
   f. a 3 dB directional coupler 178 having three ports 180, 182, 184, coupler 178 being in direct communication via port 180 with the waveguide line 174; and
   g. a circulator 186 for isolating the first and second magnetrons 148, 154, from reflected power from the accelerator 138, which has three ports 188, 190, 192, with port 192 having an output leg terminating in a dummy load, circulator 186 being in direct communication via port 188 and waveguide 174 with directional coupler 178 and via port 190 and waveguide 174 with the first accelerator section 140 of linear accelerator 138, (II) a second section 194 comprising:
   a. a slave magnetron 196 having an outlet port 198 and a frequency tuning stub 200;
   b. a high power pulse generator 202 connected to the slave magnetron 196;
   c. a circulator 204 having four ports 206, 208, 210, 212, with port 210 having an output leg terminating in a dummy load, circulator 204 being located in direct communication via port 206 with outlet port 198 of slave magnetron 196; and
   d. a waveguide 214 for transmitting power from port 208 of the circulator 204 to the second accelerator section 142 of the linear accelerator 138, (III) a high power coaxial line or waveguide 216 with in-line phase shifter 218 in direct communication with port 184 of directional coupler 178 of the first section 146 and port 212 of circulator 204 of the second section 194 of microwave system 144.

As will be readily evident to those skilled in the art, the use of a separate high power pulse generator for each magnetron shown in FIG. 5, while not essential for operation, facilitates "energy hopping" or "energy jumping" by maximizing flexibility in operation. By operating the pulse generators independently, an operator can generate an energy hopping output at 4, 8 and 16 MV, 4 and 8 MV, 4 and 16 MV, or 8 and 16 MV.

As will also be readily evident to those skilled in the art, while the first and second magnetrons 148, 154, in the first section 146 of the microwave system 144 have similar power output capabilities, the slave magnetron 196 in the second section 194 can be a different power level. Similarly, while the first and second pulse generators 160, 162 should be similar, pulse generator 202 can be a different power level. It could also have a shorter pulse length, which may be useful in particular applications.

As noted above, the inventive radiation source 136 shown in FIG. 5 may operate at 4, 8 and/or 16 MV. In the 4 MV mode, only the first magnetron 148 in the first section 146 of the microwave system 144 is used. The output of the first magnetron 148 is 2 MW of which half goes into the dummy load. With 1 MW in the first accelerator section 140 the beam exiting this section is at 4 MV. The electron beam then passes through the second accelerator section 142, which is not powered. The beam then exits the second accelerator section 142 at 4 MV.

In the 8 MV mode, the first and second magnetrons 148, 154 in the first section 146 of the microwave system 144 are used. The output of each magnetron is 2 MW so the hybrid output is 4 MW. This goes into the first accelerator section 140 to produce 8 MV acceleration. The beam then enters the second accelerator section 142, which is not powered. The beam then exits the second accelerator section 142 at 8 MV.

In the 16 MV mode, the first, second, and slave magnetrons 148, 154, 196 are used, the output from each being 2 MW. As such, the output going into the first accelerator section 140 will be 4 MW, while the output going into the second accelerator section 142 is 2 MW. The beam leaving the first accelerator section 140 is at 8 MV and where the second accelerator section 142 has an energy gain of 8 MV, the beam that exits the second accelerator section 142 will be at 16 MV.

In the 16 MW mode, the phase shifter 218 may be used to change the phase of the slave magnetron 196 output, this enabling an operator to vary the output energy of radiation source 136 over a wide range.

Figure 6:
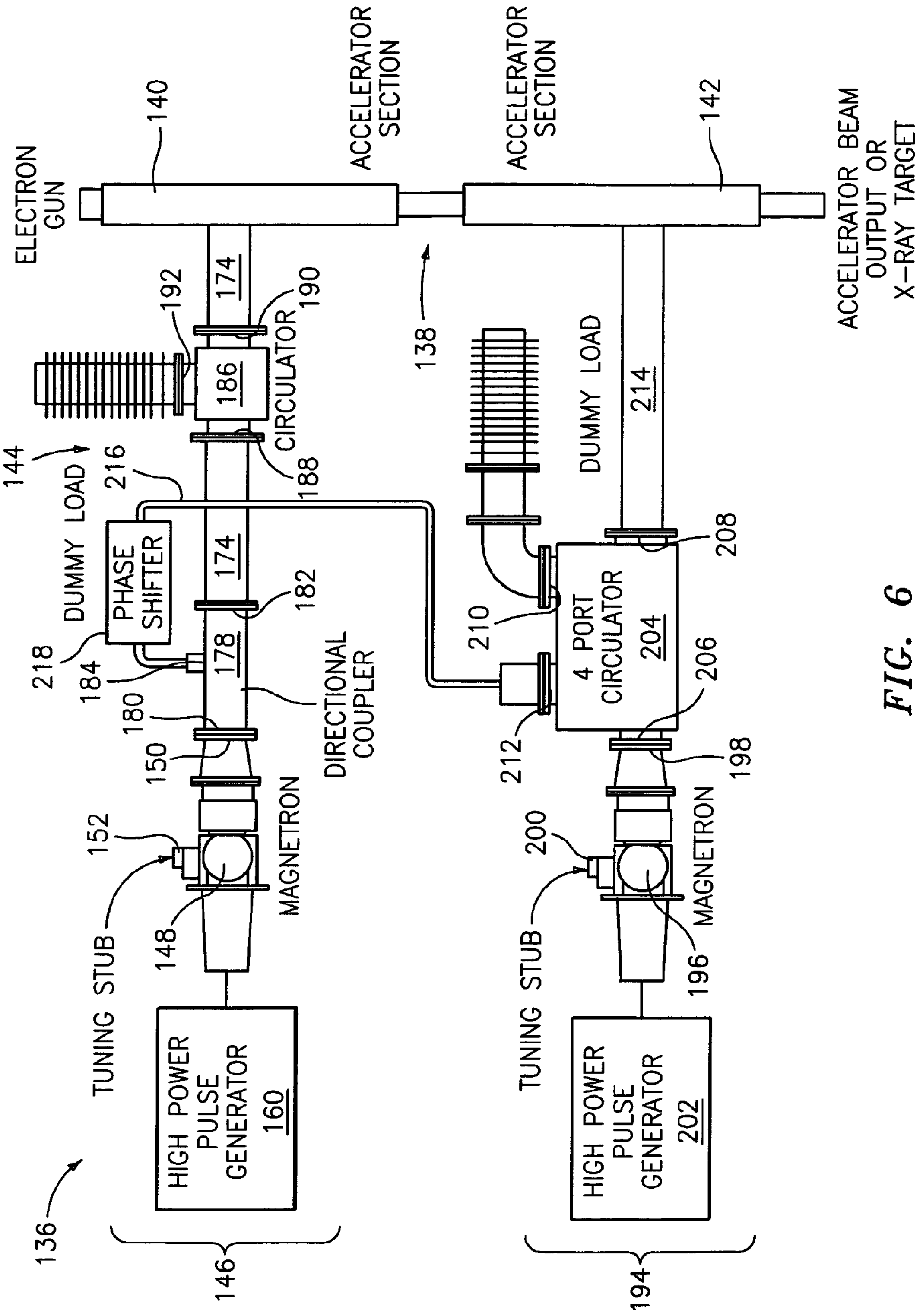
FIG. 6 is a simplified plan view of yet another preferred embodiment of the radiation source of the present invention where two magnetrons, each with an associated high power pulse generator, are used to provide the radiation source with the capability of operating at two different energy levels.

In FIG. 6, the second magnetron 154, second pulse generator 162, and magic T coupler 164 have been removed from the first section 146 of the microwave system 144, resulting in a radiation source capable of operating at two different energies.

While various embodiments of the present invention have been described above, it should be understood that they have been presented by way of example only, and not limitation. Thus, the breadth and scope of the present invention should not be limited by any of the exemplary embodiments.

The invention claimed is:

1. A microwave system for driving a linear accelerator, which comprises:
   (a) at least one pair of magnetrons arranged in parallel and having equal waveguide lengths;
   (b) one or two high power pulse generators for each magnetron pair, wherein the pulse generator(s) is connected to one or both magnetrons in the magnetron pair;
   (c) coupling means for coupling outputs from each magnetron in a magnetron pair, and optionally for further coupling already coupled outputs from the magnetron pairs; and
   (d) at least one waveguide for transmitting coupled output from the coupling means to the linear accelerator, wherein the waveguide(s) has a section with a mismatch for reflecting a small amount of power from each magnetron in a magnetron pair into output from the other magnetron.

2. The microwave system of claim 1, wherein the coupling means is a hybrid microwave device selected from the group of magic T couplers, narrow wall couplers, broad wall couplers, and short slot hybrids.

3. The microwave system of claim 2, wherein the hybrid microwave device is a magic T coupler.

4. A microwave system for driving a linear accelerator, which comprises:

(a) a plurality of magnetrons including at least one master magnetron and at least one slave magnetron;

(b) at least one high power pulse generator, wherein the pulse generator(s) is connected to one or more magnetrons;

(c) a coaxial line or waveguide in communication with the master magnetron(s) and the slave magnetron(s) for injecting small amounts of power from the master magnetron(s) into output from the slave magnetron(s); and (d) at least one waveguide for transmitting the outputs from the magnetrons to the linear accelerator, wherein the system further comprises coupling means for coupling outputs from at least some of the magnetrons, and optionally for further coupling already coupled outputs from the magnetrons.

5. The microwave system of claim 4, wherein the coupling means is a hybrid microwave device selected from the group of magic T couplers, narrow wall couplers, broad wall couplers, and short slot hybrids.

6. The microwave system of claim 5, wherein the hybrid microwave device is a magic T coupler.

7. A microwave system for driving a linear accelerator, which comprises: at least one pair of magnetrons arranged in parallel and having equal waveguide lengths; at least one pulse generator to energize the magnetrons; means for synchronizing outputs from the magnetrons; and at least one waveguide for transmitting the synchronized outputs or power from the magnetrons to the linear accelerator, wherein the means for synchronizing outputs from the magnetrons comprises a section with a mismatch in the waveguide(s) for reflecting a small amount of power from each magnetron in a magnetron pair into output from the other magnetron in that pair.

8. A radiation source comprising a linear accelerator, and connected thereto, a microwave system, wherein the microwave system comprises:

(a) at least one pair of magnetrons arranged in parallel and having equal waveguide lengths;

(b) one or two high power pulse generators for each magnetron pair, wherein the pulse generator(s) is connected to one or both magnetrons in the magnetron pair;

(c) coupling means for coupling outputs from each magnetron in a magnetron pair, and optionally for further coupling already coupled outputs from the magnetron pairs; and (d) at least one waveguide for transmitting coupled output from the coupling means to the linear accelerator, wherein the waveguide(s) has a section with a mismatch for reflecting a small amount of power from each magnetron in a magnetron pair into output from the other magnetron.

9. The radiation source of claim 8, wherein the coupling means of the microwave system is a hybrid microwave device selected from the group of magic T couplers, narrow wall couplers, broad wall couplers, and short slot hybrids.

10. The radiation source of claim 9, wherein the hybrid microwave device of the microwave system is a magic T coupler.

11. A radiation source comprising a linear accelerator, and connected thereto, a microwave system, wherein the microwave system comprises:

(a) a plurality of magnetrons including at least one master magnetron and at least one slave magnetron;

(b) at least one high power pulse generator, wherein the pulse generator(s) is connected to one or more magnetrons;

(c) a coaxial line or waveguide in communication with the master magnetron(s) and the slave magnetron(s) for injecting small amounts of power from the master magnetron(s) into output from the slave magnetron(s); and (d) at least one waveguide for transmitting the outputs from the magnetrons to the linear accelerator.

12. The radiation source of claim 11, wherein the microwave system further comprises coupling means for coupling outputs from at least some of the magnetrons, and optionally for further coupling already coupled outputs from the magnetrons.

13. The radiation source of claim 12, wherein the coupling means of the microwave system is a hybrid microwave device selected from the group of magic T couplers, narrow wall couplers, broad wall couplers, and short slot hybrids.

14. The radiation source of claim 13, wherein the hybrid microwave device of the microwave system is a magic T coupler.

15. A radiation source comprising a linear accelerator, and connected thereto, a microwave system, wherein the microwave system comprises: a plurality of magnetrons; at least one pulse generator to energize the magnetrons;

means for synchronizing outputs from the magnetrons; and at least one waveguide for transmitting the synchronized outputs or power from the magnetrons to the linear accelerator, wherein the means for synchronizing outputs from the magnetrons of the microwave system comprises a section with a mismatch in the waveguide(s) for reflecting a small amount of power from each magnetron in a magnetron pair into output from the other magnetron in that pair.

16. A radiation source comprising a linear accelerator, and connected thereto, a microwave system, wherein the microwave system comprises: a plurality of magnetrons; at least one pulse generator to energize the magnetrons; means for synchronizing outputs from the magnetrons; and at least one waveguide for transmitting the synchronized outputs or power from the magnetrons to the linear accelerator, wherein the means for synchronizing outputs from the magnetrons of the microwave system comprises a coaxial line or waveguide in communication with one or more master magnetron(s) and one or more slave magnetron(s) for injecting small amounts of power from the master magnetron(s) into output from the slave magnetron(s).

17. A method of driving a linear accelerator, the method comprising: employing at least one pair of magnetrons arranged in parallel and having equal waveguide lengths; synchronizing outputs from the magnetrons; and delivering the synchronized outputs or power to a linear accelerator, wherein the outputs from the magnetrons are synchronized by reflecting power from each magnetron in a magnetron pair arranged in parallel back to the other magnetron in that pair.

* * * * *